United States Patent
Toh et al.

(10) Patent No.: US 9,484,530 B2
(45) Date of Patent: Nov. 1, 2016

(54) INTEGRATED CIRCUIT STRUCTURES WITH SPIN TORQUE TRANSFER MAGNETIC RANDOM ACCESS MEMORY HAVING INCREASED MEMORY CELL DENSITY AND METHODS FOR FABRICATING THE SAME

(71) Applicant: GLOBALFOUNDRIES Singapore Pte. Ltd., Singapore (SG)

(72) Inventors: Eng Huat Toh, Singapore (SG); Xuan Anh Tran, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 87 days.

(21) Appl. No.: 14/537,966

(22) Filed: Nov. 11, 2014

(65) Prior Publication Data
US 2016/0133669 A1    May 12, 2016

(51) Int. Cl.
*H01L 43/12* (2006.01)
*H01L 43/02* (2006.01)
*H01L 43/08* (2006.01)
*H01L 45/00* (2006.01)
*H01L 27/22* (2006.01)
*H01L 27/24* (2006.01)

(52) U.S. Cl.
CPC ........... *H01L 43/12* (2013.01); *H01L 27/224* (2013.01); *H01L 27/249* (2013.01); *H01L 27/2409* (2013.01); *H01L 27/2463* (2013.01); *H01L 43/02* (2013.01); *H01L 43/08* (2013.01); *H01L 45/04* (2013.01); *H01L 45/06* (2013.01); *H01L 45/1233* (2013.01)

(58) Field of Classification Search
CPC combination set(s) only.
See application file for complete search history.

(56) References Cited

U.S. PATENT DOCUMENTS

| 8,416,600 B2 | 4/2013 | Lin et al. | |
| 2011/0280075 A1* | 11/2011 | Shirota | G11C 5/063 365/185.17 |
| 2012/0241826 A1* | 9/2012 | Satoh | H01L 27/228 257/295 |

OTHER PUBLICATIONS

Alpuim et al., "Doping of Amorphous and Microcrystalline Silicon Films Deposited At Low Substrate Temperatures By Hot-Wire Chemical Vapor Deposition", Journal of Vacuum Science and Technology A, pp. 1-29.
Kar et al., "Novel Bi-Layer Poly-Silicon Channel Vertical Flash Cell for Ultrahigh Density 3D SONOS NAND Technology", 2011, pp. 65-66.

(Continued)

*Primary Examiner* — Mohammad Islam
*Assistant Examiner* — Ratisha Mehta
(74) *Attorney, Agent, or Firm* — Lorenz & Kopf, LLP

(57) ABSTRACT

STT-MRAM integrated circuit and method for fabricating the same are disclosed. An integrated circuit includes a word line layer, a bit line layer, and an MRAM stack in contact with the bit line metal layer. The integrated circuit further includes a first doped silicon layer in contact with the MRAM stack, the first doped silicon layer including conductivity-determining ions of a first type, and a second doped silicon layer in contact with the first doped silicon layer and further in contact with the word line layer, the second doped silicon layer including conductivity-determining ions of a second type that is opposite the first type. Still further, the integrated circuit includes a third doped silicon layer in contact with the second doped silicon layer and a source line layer in electrical contact with the third doped silicon layer.

12 Claims, 18 Drawing Sheets

(56) References Cited

OTHER PUBLICATIONS

Lee et al., "2-Stack 1D-1R Cross-Point Structure With Oxide Diodes As Switch Elements for High Density Resistance RAM Applications", IEDM, 2007, pp. 771-774.

Song et al., "Bidirectional Two-Terminal Switching Device for Crossbar Array Architecture", IEEE Electron Device Letters, Aug. 2011, pp. 1023-1025, vol. 32, No. 8.

Sousa et al., "Vertical Integration of a Spin Dependent Tunnel Junction With An Amorphous Si Diode for MRAM Application", IEEE Transactions on Magnetics, Sep. 1999, pp. 2832-2834, vol. 35, No. 5.

Whang et al., "Novel 3-Dimensional Dual Control-Gate With Surrounding Floating-Gate (DC-SF) NAND Flash Cell for 1Tb File Storage Application", IEDM, 2010, pp. 29.7.1-29.7.4.

\* cited by examiner

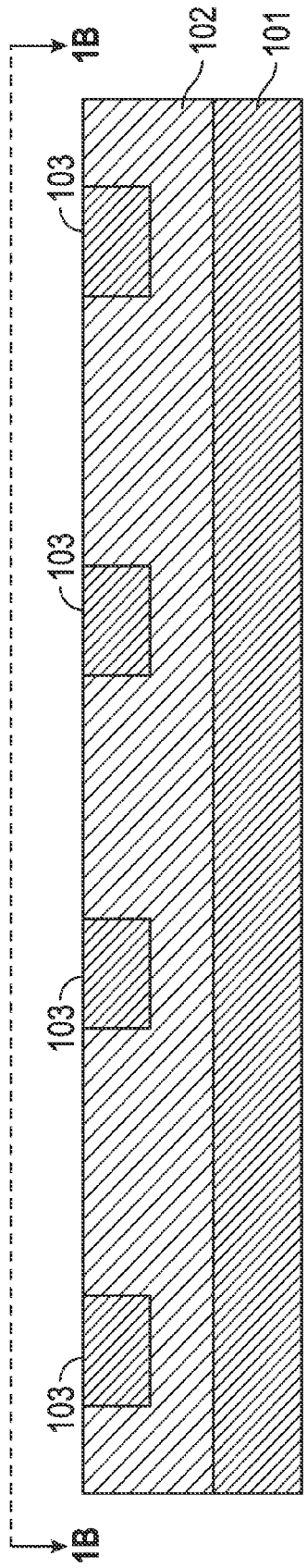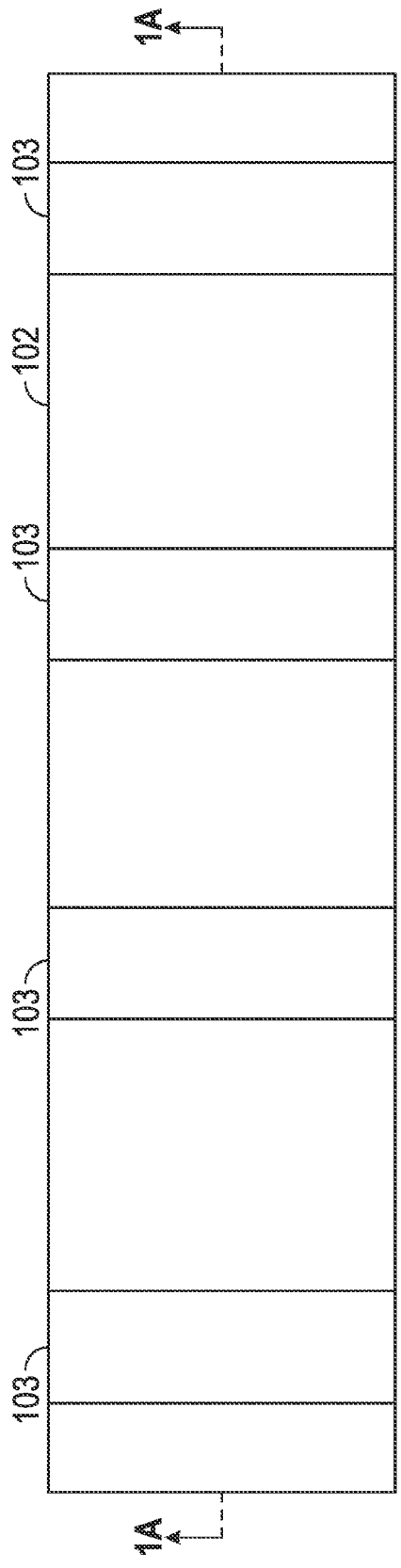
FIG. 1A
FIG. 1B

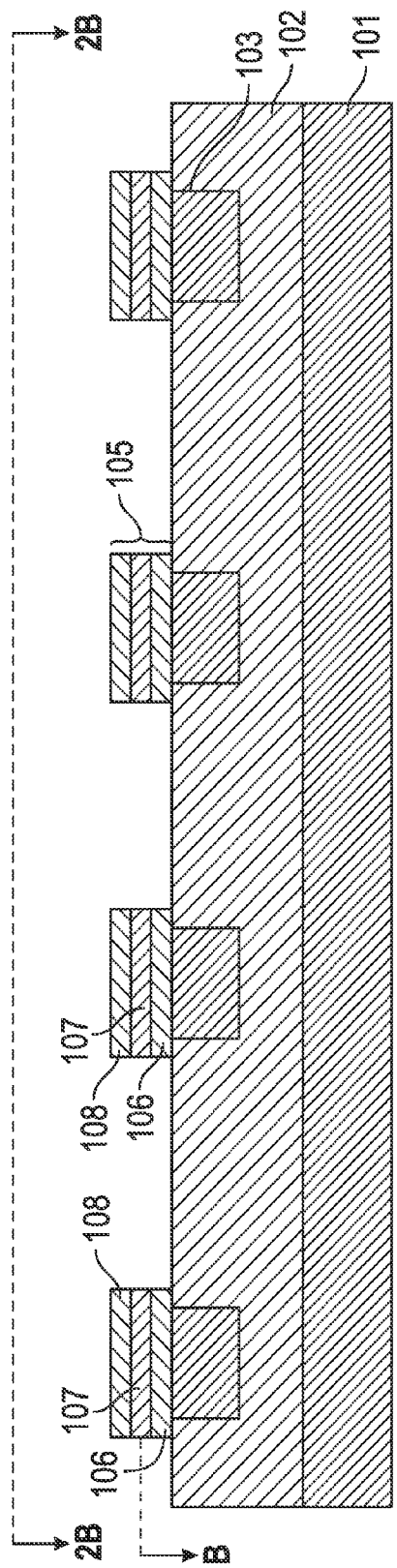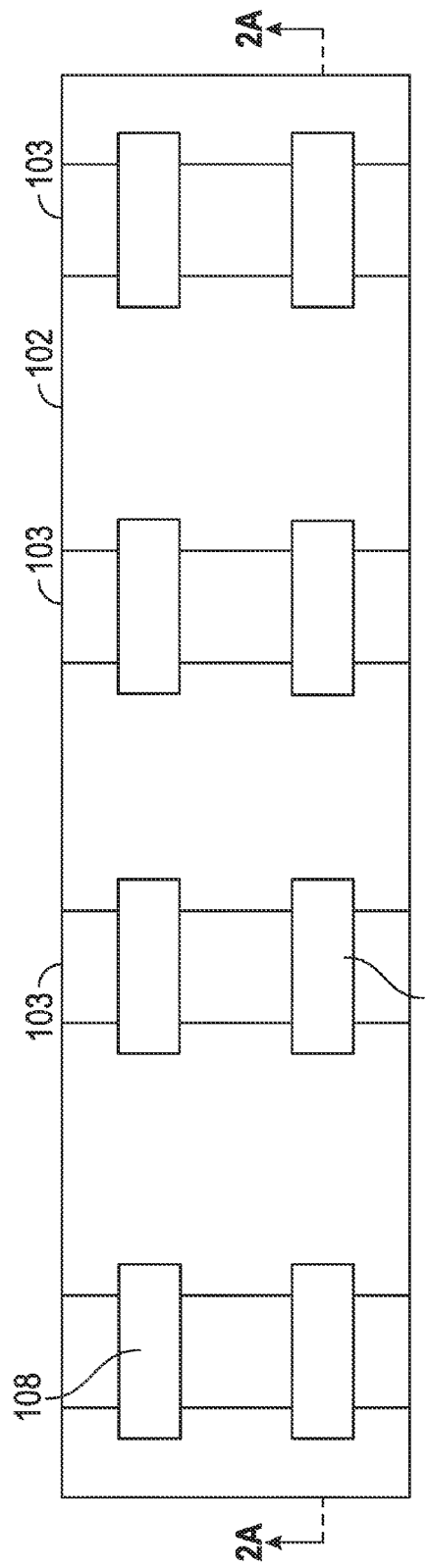
FIG. 2A
FIG. 2B

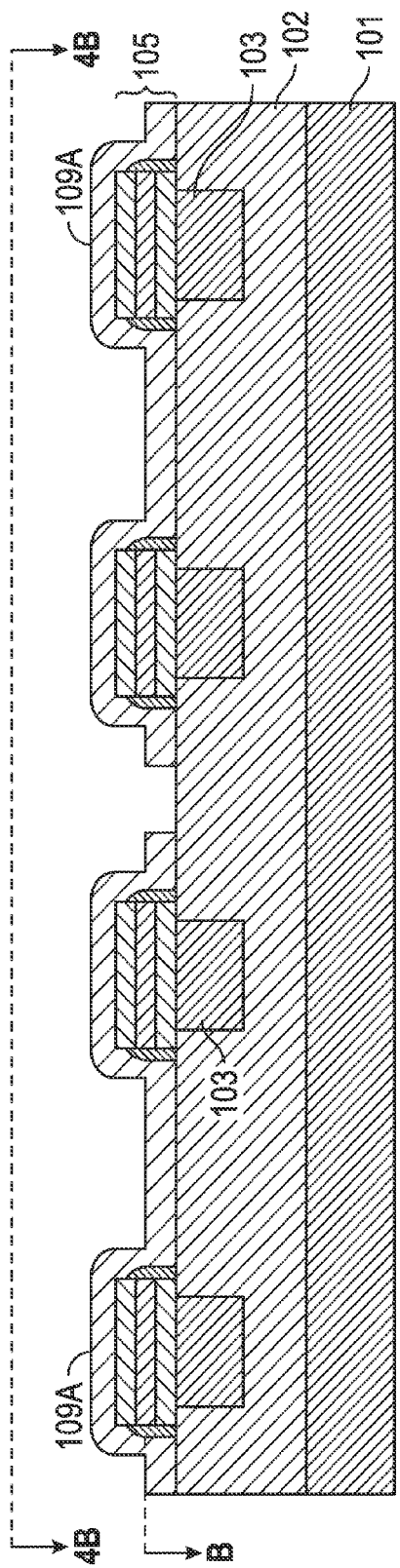
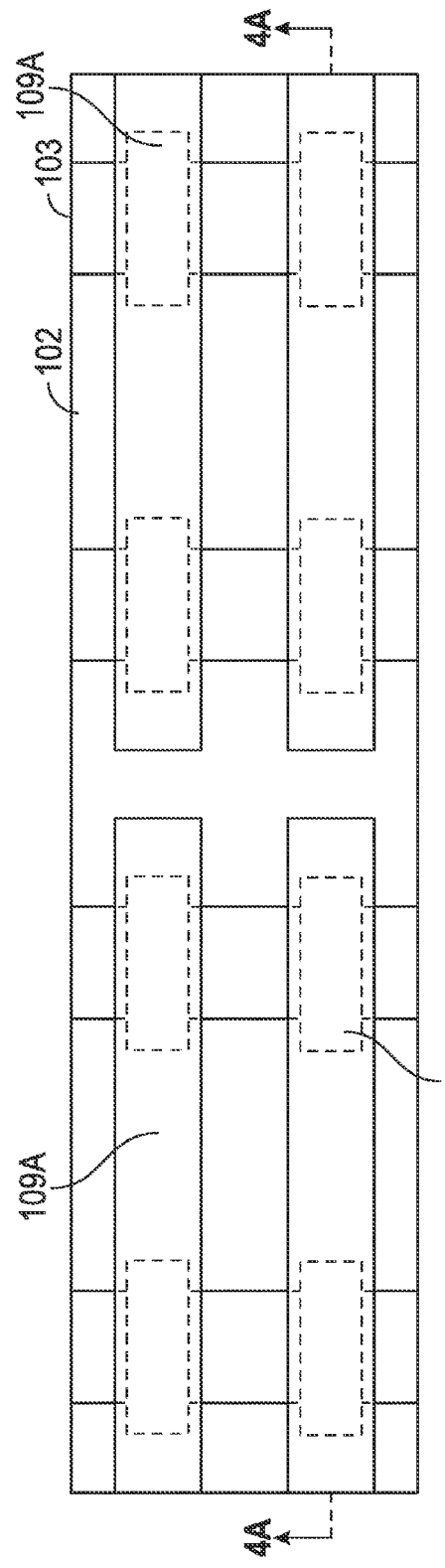
FIG. 4A
FIG. 4B

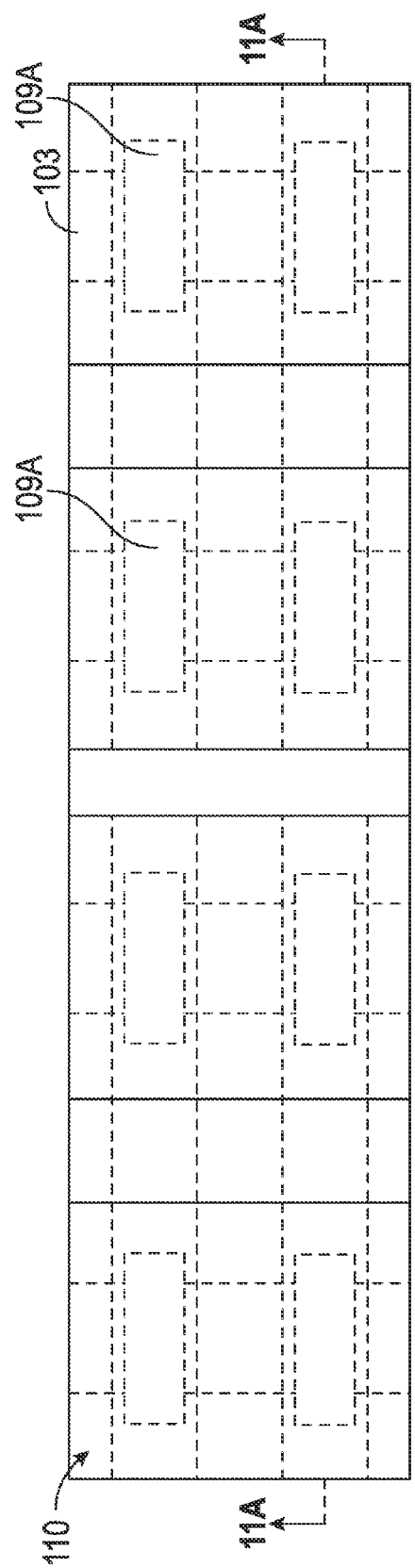

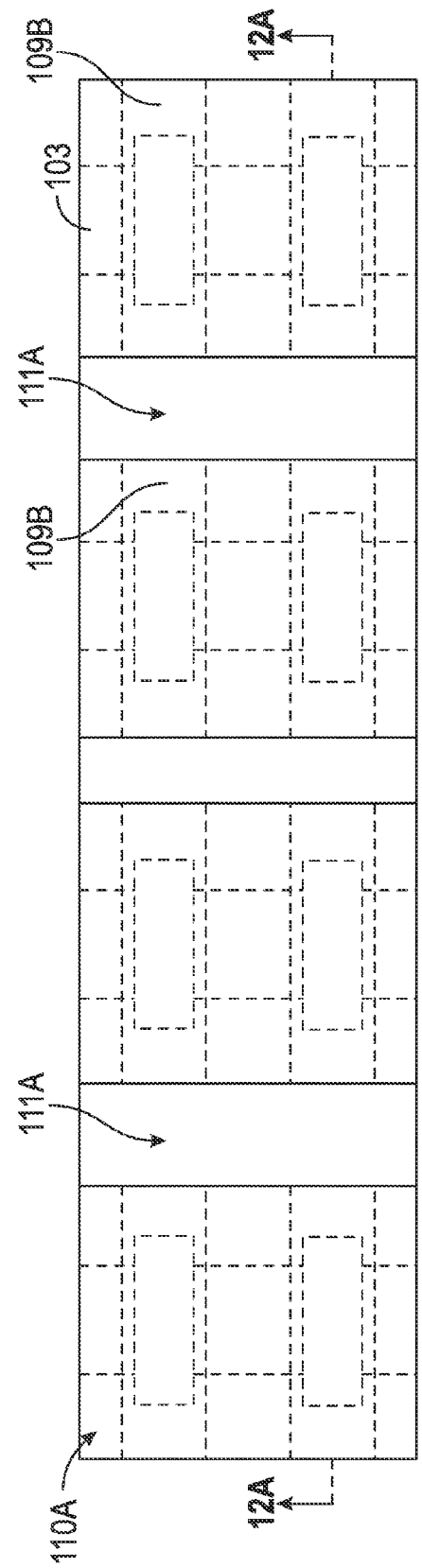

INTEGRATED CIRCUIT STRUCTURES WITH SPIN TORQUE TRANSFER MAGNETIC RANDOM ACCESS MEMORY HAVING INCREASED MEMORY CELL DENSITY AND METHODS FOR FABRICATING THE SAME

TECHNICAL FIELD

The present disclosure generally relates to integrated circuits and methods for fabricating integrated circuits. More particularly, the present disclosure relates to spin torque transfer magnetic random access memory (STT-MRAM) structures in integrated circuits with increased memory cell density and methods for fabricating the same.

BACKGROUND

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charges, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between higher and lower electrical resistance states across the MRAM magnetic layers is typically high. Thus, when multiple cells are arranged in an MRAM array, the programming current directed to one memory cell may induce a field change in the free layer of an adjacent cell. This potential for write disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ). An MTJ is a magnetoresistive data storing element including two magnetic layers (one pinned and one free) and an insulating layer in between the two magnetic layers; a bit line, a word line; a source line; and an access transistor. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density (JO, the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between higher and lower electrical resistance states, thereby improving read operations in the magnetic domain.

Presently-known STT-MRAM structures and methods for fabricating such structures all suffer from several drawbacks. For example, the switch current required to switch the magnetization direction of the MTJ element from parallel to anti-parallel is 20-50% larger than that required to switch from anti-parallel to parallel. Furthermore, in a conventional STT MTJ element (1 transistor, +1 MTJ), the larger parallel-to-anti-parallel switching current is limited by "source degeneration" or the so called "source-site loading" effect. This source degeneration effect constrains the amount of current flowing through the MTJ element and may prevent the MTJ element from switching the magnetization direction from anti-parallel to parallel reliably. Accordingly, it is desirable to have an STT MTJ element that is not limited by the source degeneration effect to ensure reliable switching of the magnetization direction of the MTJ element from parallel to anti-parallel.

One particular solution to the source degeneration problem has been proposed by Liu et al., U.S. Pat. No. 8,416,600 B2 (issued Apr. 9, 2013). Liu et al. propose connecting the bit line with the fixed layer, and the free layer with the drain of the switching device (Liu et al., FIG. 3). This configuration is implemented either using a four-metallization-layer stack (Liu et al., FIG. 5) or a reversal of the MTJ free and fixed layers (Liu et al., FIG. 6). However, the four-metallization-layer stack requires a large amount of space to implement, which is impractical for many newer devices that have tight spacing requirements, and the reversal of the MTJ free and fixed layers have proven to result in poor fixed layer quality due to over-etching thereof.

Over recent years, there has been a constant drive to reduce the physical size of various consumer electronic products that employ integrated circuits. The demand for smaller consumer products with greater capability has resulted in the scaling or reduction in the physical size of integrated circuit devices that are employed in such consumer products. The reduction in size of the integrated circuits has been achieved by, among other things, reducing the physical size of the various semiconductor devices, e.g., the memory cells, and by greatly increasing the density of such cells in a given area. As noted above, the solutions proposed by Liu et al. to prevent the source degeneration problem are not capable of conforming to the paradigm of reduction in physical size.

Accordingly, it is desirable to provide robust and reliable STT-MRAM structures. Additionally, it is desirable to provide methods for the fabrication of such structures that are easily integrated into existing process flow schemes used in semiconductor fabrication facilities. Still further, it is desirable to provide such structures and methods that prevent the source degeneration problem while maintaining a small cell size suitable for use in modern consumer electronic devices. Furthermore, other desirable features and characteristics of the present disclosure will become apparent from the subsequent detailed description and the appended claims, taken in conjunction with the accompanying drawings and the foregoing technical field and background.

BRIEF SUMMARY

Spin torque transfer magnetic random access memory in integrated circuits and methods for fabricating the same are disclosed. In one exemplary embodiment, an integrated circuit includes a word line layer, a bit line metal layer, and an MRAM stack including an MTJ layer in contact with the bit line metal layer. The integrated circuit further includes a first doped silicon layer and a spacer structure that separates the MTJ layer of the MRAM stack from the first doped silicon layer, the first doped silicon layer including conductivity-determining ions of a first type, and a second doped silicon layer in contact with the first doped silicon layer and further in contact with the word line metal layer, the second doped silicon layer including conductivity-determining ions of a second type that is opposite the first type. Still further, the integrated circuit includes a third doped silicon layer in contact with the second doped silicon layer, the third doped silicon layer including conductivity-determining ions of the first type, and a source line layer in electrical contact with the third doped silicon layer.

In another exemplary embodiment, a method for fabricating an integrated circuit includes forming a word line layer, forming a bit line layer, and forming a magnetic random access memory (MRAM) stack that includes a top electrode, a bottom electrode, and an MTJ layer in contact with the bit line metal layer. The method further includes forming a first doped silicon layer in contact with the top electrode of the MRAM stack and a spacer structure separating the MTJ layer of the MRAM stack from the first doped silicon layer, the first doped silicon layer including conductivity-determining ions of a first type and forming the first doped silicon layer into small strips of cell regions. Further, the method includes depositing an interlayer dielectric layer, CMP, and forming a trench through the first doped silicon layer to expose an end portion of the first doped silicon layer, thereby defining a series of cells by forming Still further, the method includes forming a second doped silicon layer in contact with the end portion of the first doped silicon layer and further in contact with the word line layer, the second doped silicon layer including conductivity-determining ions of a second type that is opposite the first type, forming a third doped silicon layer in contact with the second doped silicon layer, the third doped silicon layer including conductivity-determining ions of the first type, and forming a source line layer in electrical contact with the third doped silicon layer.

In yet another exemplary embodiment, an integrated circuit includes a word line layer, a bit line layer, an interlayer dielectric (ILD) layer separating the word line layer from the bit line layer, a bottom electrode in contact with the bit line layer, a fixed layer in contact with the bottom electrode, a barrier layer in contact with the fixed layer, a free layer in contact with the barrier layer and separated from the fixed layer by the barrier layer, and a top electrode in contact with the free layer. The integrated circuit further includes an n-type first doped silicon layer in contact with the top electrode, the first doped silicon layer including an end portion spaced apart from the top electrode, and a p-type second doped silicon layer in contact with the end portion of the first doped silicon layer, the word line layer, and the ILD layer. Still further, the integrated circuit includes third, n-type doped silicon layer in contact with the second doped silicon layer and a source line layer in electrical contact with the third doped silicon layer.

BRIEF DESCRIPTION OF THE DRAWINGS

The present disclosure will hereinafter be described in conjunction with the following drawing figures, wherein like numerals denote like elements, and wherein:

FIGS. 1A-10 illustrate, in cross section, STT-MRAM structures and methods for fabricating STT-MRAM integrated circuits in accordance with one embodiment of the present disclosure; and FIGS. 11A-16 illustrate, in cross section, STT-MRAM structures and methods for fabricating STT-MRAM integrated circuits in accordance with another embodiment of the present disclosure.

DETAILED DESCRIPTION

Figure 3A:
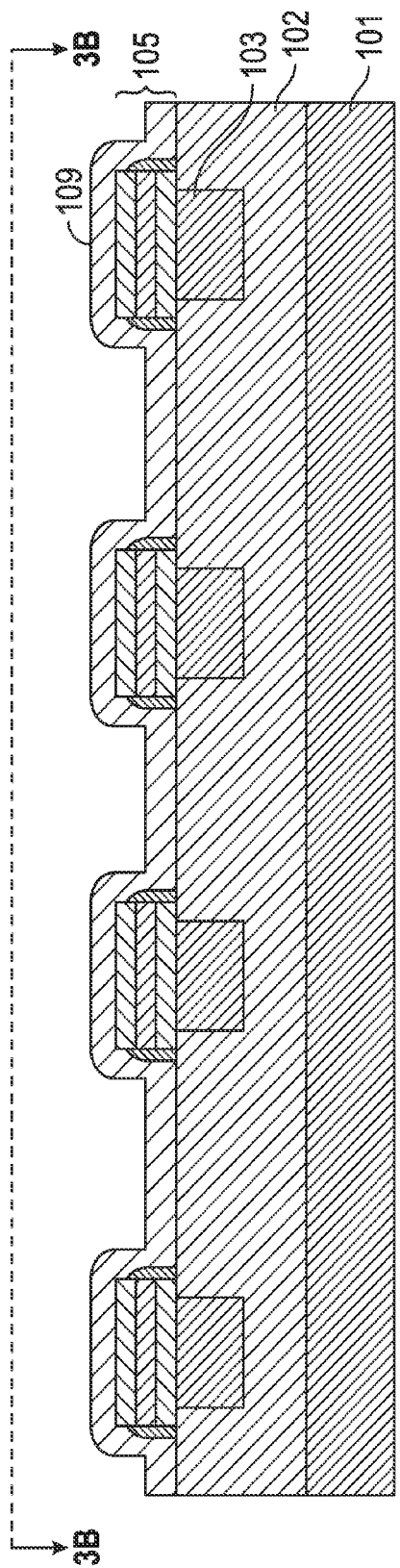

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to spin torque transfer magnetic random access memory (STT-MRAM) integrated circuit structures and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

As used herein, it will be understood that when an element or layer is referred to as being "on," "connected to" or "coupled to" another element or layer, it may be directly on, connected to, or coupled to the other element or layer, or intervening elements or layers may be present. Further, spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

FIGS. 1A-10 illustrate, in a cross-sectional view and in a top view (with "A" designated Figures showing the cross-sectional view and the "B" designated Figures showing the top view), STT-MRAM integrated circuit structures and methods for fabricating STT-MRAM integrated circuit structures in accordance with various embodiments of the present disclosure. The partially-formed integrated circuit structure illustrated in FIGS. 1A and 1B includes two metal layers 101, 103. Metal layers 101, 103 may be oriented substantially perpendicularly to one another. Further, each of metal layers 101, 103 may be provided in the form of a series of parallel metal "lines," as shown particularly with regard to metal layer 103 in FIG. 1B. Accordingly, each of the metal lines of metal layer 101 is substantially parallel to each of the meal lines of metal layer 103. In an embodiment, the metal layer 101 functions as a word line and the metal layer 103 functions as a bit line of the STT-MRAM structure to be formed. The metal layers 101, 103 may be provided within and/or above an inter-layer dielectric (ILD) layer 102, separating the metal layers 101, 103 from each other and from other metal layers of the integrated circuit structure. By the term "within," it is meant that the metal layers 101, 103 are embedded in the ILD layer 102, wherein, optionally, a top surface of the bit line metal layer 103 is substantially coplanar with a top surface of the ILD layer 102, and the bit line metal layer 103 extends downward into the ILD layer 102 (the coplanar top surface may be achieved by a planarization process, such as chemical mechanical planarization, performed after the deposition of the metal material for metal layer 103, as will be described in greater detail below). The ILD layer 102 may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The metal layers 101, 103 may be formed of a conductive material, such as a metal or a metal alloy. In an embodiment, the metal layers are formed of copper, for example, and/or other commonly used conductive metals. In one embodiment, the metal layers 101, 103 are in physical and electrical connection with other metallization layers of the integrated circuit (not shown). In an alternate embodiment, the word line layer 101 is not formed of metal, but rather is formed from or as part of a semiconductor substrate.

The ILD 102 layer and the metal layer 101, 103 may be formed through conventional techniques. For example, the layers 101, 103 may be formed using photolithographic patterning and etching procedures. That is, a photoresist layer is deposited and then is exposed to an image pattern and treated with a developing solution to form pattern openings within the photoresist layer. With the openings thus formed, the substrate ILD layer 102 may be etched to form parallel spaces therein. Thereafter, the material for the metal layers 101, 103 may be deposited using conventional deposition techniques according to the particular material selected, such as one of the various known vapor deposition processes.

Though not illustrated for simplicity in FIGS. 1A and 1B, the metal layers 101, 103 may be formed over other ILD and/or metallization layers, and also over an active region of a semiconductor substrate forming part of the integrated circuit structure. The bottom electrode 112 may be formed during back-end-of-line processes (BEOL). For example, in one embodiment, the STT-MRAM feature according to the present disclosure may be formed during BEOL processes, for example between the $2^{nd}$ and $3^{rd}$ metallization layers (M2/M3) of the device, although the embodiments are not to be understood as limited to such. The substrate may include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET) and bipolar junction transistors (BJT)), and/or other suitable elements. This microelectronic element is used as a selector device for an exemplary STT-MRAM cell, as is known in the art.

With reference now to FIGS. 2A and 2B, three additional layers 106, 107, and 108 are deposited and patterned over the bit line metal layer 103. These three layers 106, 107, and 108 are patterned so as to be formed in segments that are wider than and centered over the bit line metal layer 103 in the width direction (left to right in the cross-section of FIG. 2A), with spaces between each segment in the width direction. In the length direction (top to bottom in FIG. 2B), the three additional layers 106, 107, and 108 are spaced at intervals along each line of the metal layer 103. Layer 106 is the bottom electrode of the STT-MRAM structure to be formed, layer 107 is the MTJ "stack" of the STT-MRAM structure to be formed, and layer 108 is the top electrode of the STT-MRAM structure to be formed. The top and bottom electrode 106, 108 may independently be formed of a conductive metal, such as tantalum, tantalum nitride, and/or titanium, for example. The MTJ stack layer 107 includes a pinned or fixed layer, a thin (i.e., about 1 to about 2 nm in thickness) oxide layer as a barrier layer (such as silicon oxide or magnesium oxide, for example), and a free layer (these layers of the MTJ stack are not separately illustrated for ease of illustration). The fixed layer of the STT-MRAM structure is formed (deposited) over an upper surface of the bottom electrode 106. In an exemplary embodiment, the fixed layer is formed of a platinum manganese (PtMn), iridium manganese (IrMn), nickel manganese (NiMn), or iron manganese (FeMn) material, and may include CoFeB. The free layer may be formed of CoFeB, for example. For example, in a particular embodiment, the "stack" of material layers may be as follows, from the bottom electrode 106 through a top electrode 108: a TaN bottom electrode layer, a Ta seed layer overlying the TaN bottom electrode layer, a PtMn antiferromagnetic layer over the Ta seed layer, a CoFe pinned layer overlying the PtMn antiferromagnetic layer, an Ru coupling layer overlying the CoFe pinned layer, a CoFeB reference layer overlying the Ru coupling layer, a MgO barrier layer overlying the CoFeB reference layer, a CoFeB free layer overlying the MgO barrier layer, a Ta capping layer overlying the CoFeB free layer, and a TaN top electrode overlying the Ta capping layer.

As indicated in FIG. 2A, the segments of the three layers 106, 107, and 108 may be collectively referred to as MRAM stacks 105. In alternative embodiments, as opposed to the direct physical connection illustrated, stacks 105 could be connected to the respective bit line 103 by a via or other conductive structure. In further embodiments, the order of the fixed, barrier, and free layers of the MTJ stack layer 107 may be reversed, in which case the described order of the above examples would be reversed. In alternative embodiments, the MRAM stacks 105 may be replaced with RRAM, PCRAM, or any other memory element, as are known in the art.

Figure 3B:
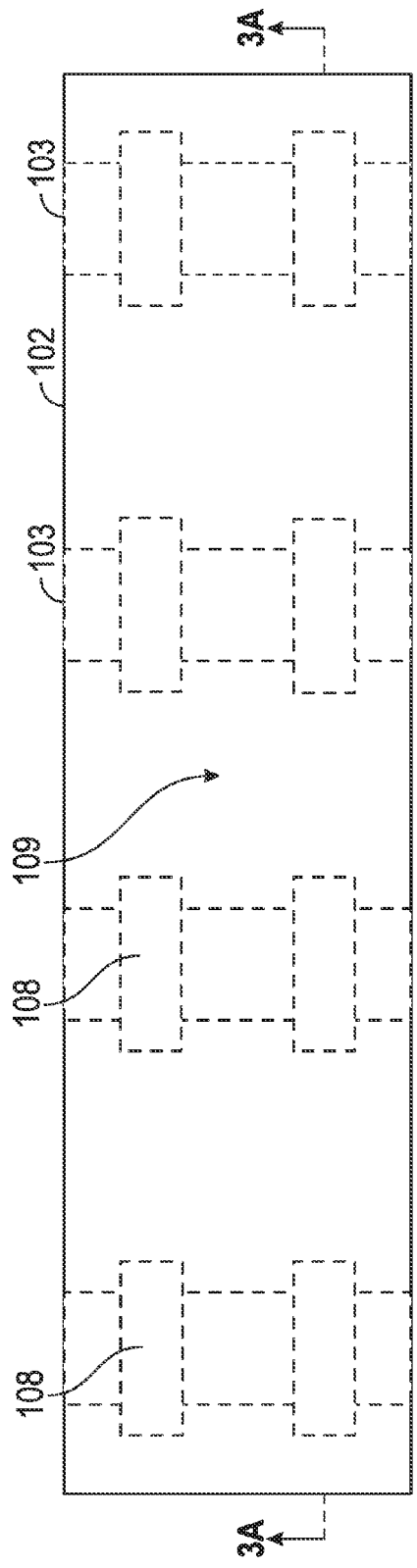

Turning now to FIGS. 3A and 3B, spacer structures are formed along sidewalls of the MRAM stacks 105 to separate the MTJ 107 from the n-type silicon so that the n-type silicon is only in contact with the top electrode, followed by the deposition of a doped silicon layer 109 over an entirety of the substrate, including over the MRAM stacks 105, exposed bit line portions 103, and over the ILD layer 102. The doped silicon layer 109 may be formed of an amorphous silicon material or a polycrystalline silicon material. The doped silicon layer 109 may be doped with conductivity-determining ions. In one exemplary embodiment, the layer 109 is doped with n-type conductivity-determining ions, as are known in the art. The doped silicon layer 109 may be deposited as stated using conformal deposition techniques such that it has a relatively consistent thickness over all surfaces of the ILD layer 102 and the MRAM stacks 105.

Figure 5A:
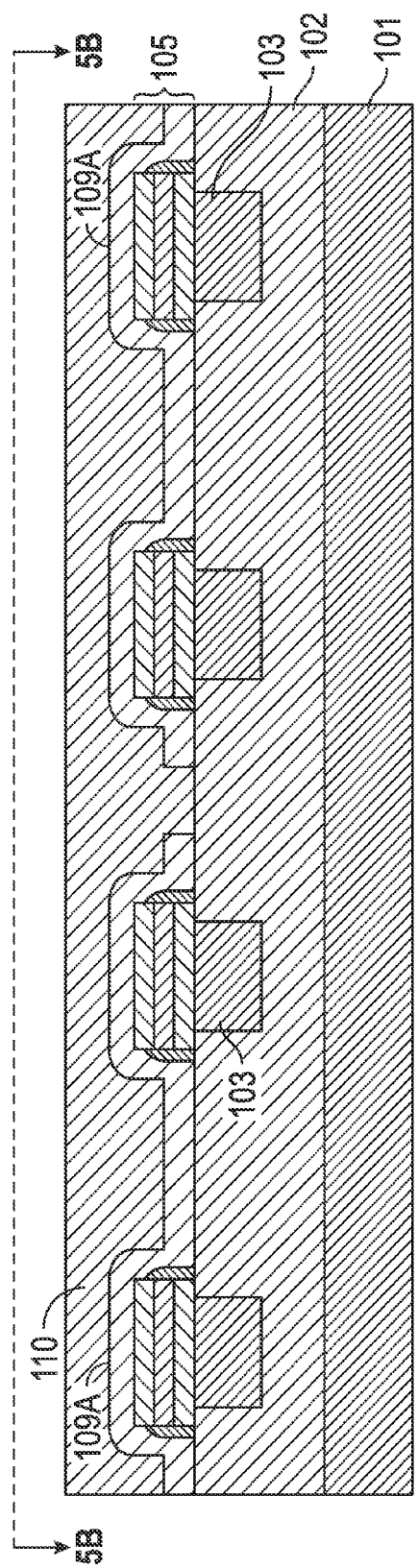
Figure 5B:
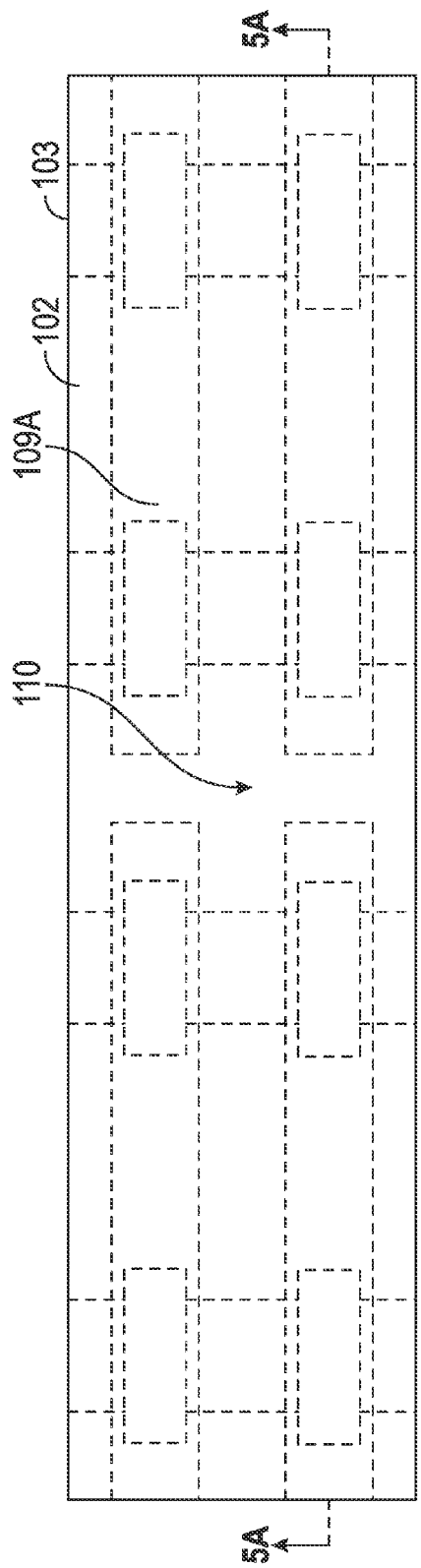

Thereafter, with attention now to FIGS. 4A and 4B, the doped silicon layer 109 is patterned, using for example photolithographic masking and patterning techniques as discussed above, into a plurality of doped silicon segments 109A. Each segment 109A covers an entirety of two MRAM stacks that are adjacent to one another in the width direction, as well as the ILD layer 102 therebetween. The segments 109A are spaced apart from one another in both the width and length directions. Subsequent to the patterning of the plurality of doped silicon segments 109, a further ILD layer 110 is formed over an entirety of the substrate, including over the segments 109A, exposed bit lines portions 103, and over the ILD layer 102 as shown in FIGS. 5A and 5B. CMP is carried out to planarize the ILD layer 201.

Figure 6A:
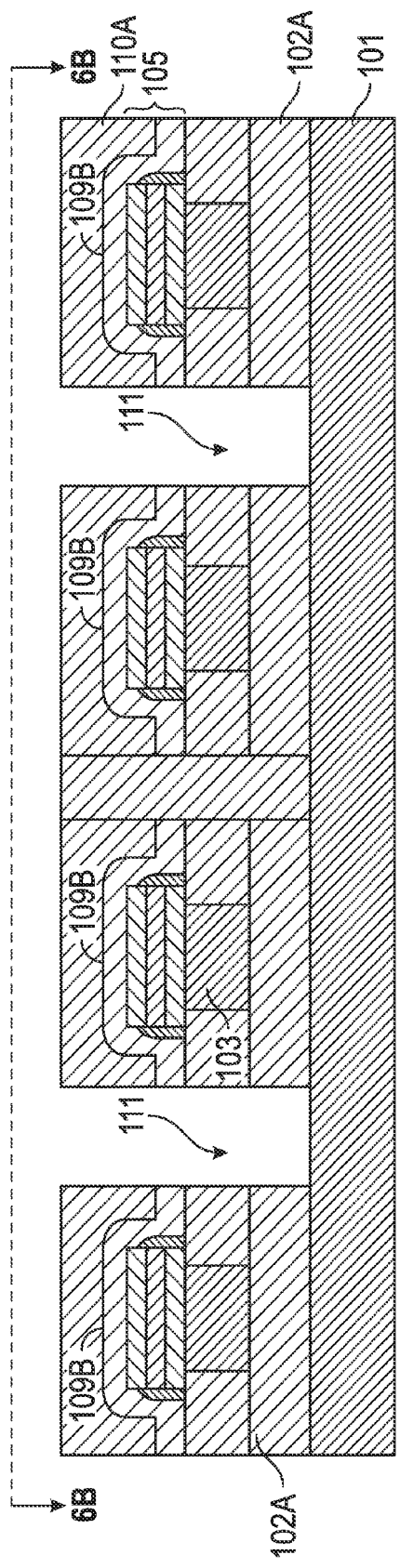
Figure 6B:
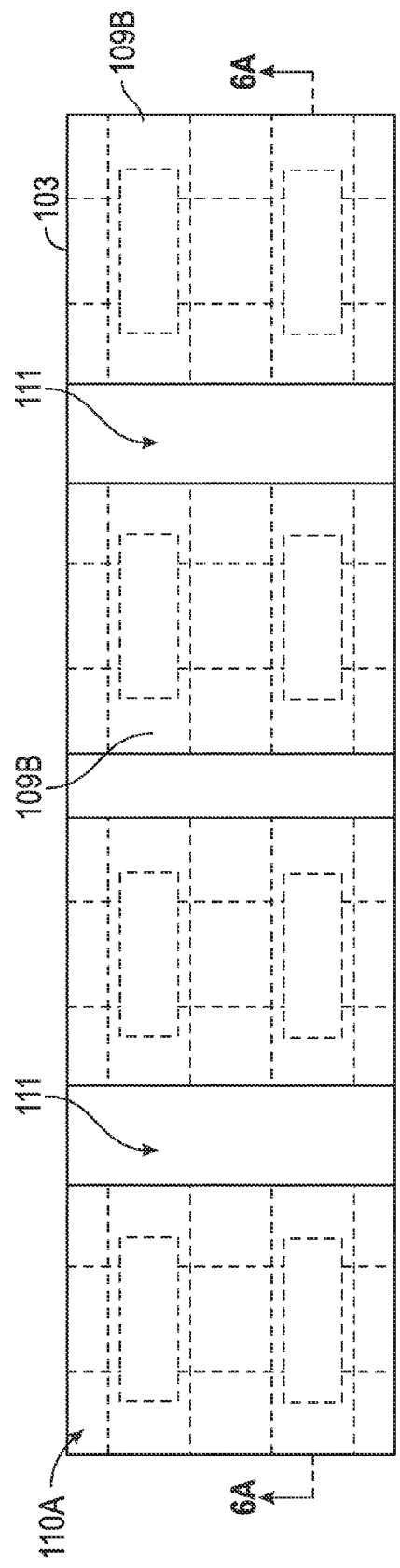

As noted above, the segments 109 extend over the ILD layer 102 between two adjacent MRAM stacks 105. With reference now to FIG. 6, trenches 111 are formed (for example, using photolithographic patterning and anisotropic etching) between these adjacent MRAM stacks 105 and through the doped silicon layer segments 109A that extends therebetween. In the width direction, therefore, the segments 109A are split in two parts by the formation of such trenches 111, resulting in a plurality of doped silicon segments 109B. Accordingly, over alternating bit lines 103, the segments 109B are separated either by a trench 111 or the ILD layer 110. The trenches 111 are formed through the ILD layer 110, the doped silicon segments 109A, and through the ILD layer 102, stopping on the word line 101 and exposing portions of the word line 101 at the bottom of the trenches 111. With the trenches thus formed in the ILD layers 110, 102 as well, the lower ILD layer 102 is separated into a plurality of segments 102A, and the upper ILD layer 110 is separated into a plurality of segments 110A, which are separated from one another in the width direction as shown in the cross-section in FIG. 6. Each such segment 102A, 110A encompasses two MRAM stacks 105 and two of the doped silicon segments 109B thereover.

Figure 7A:
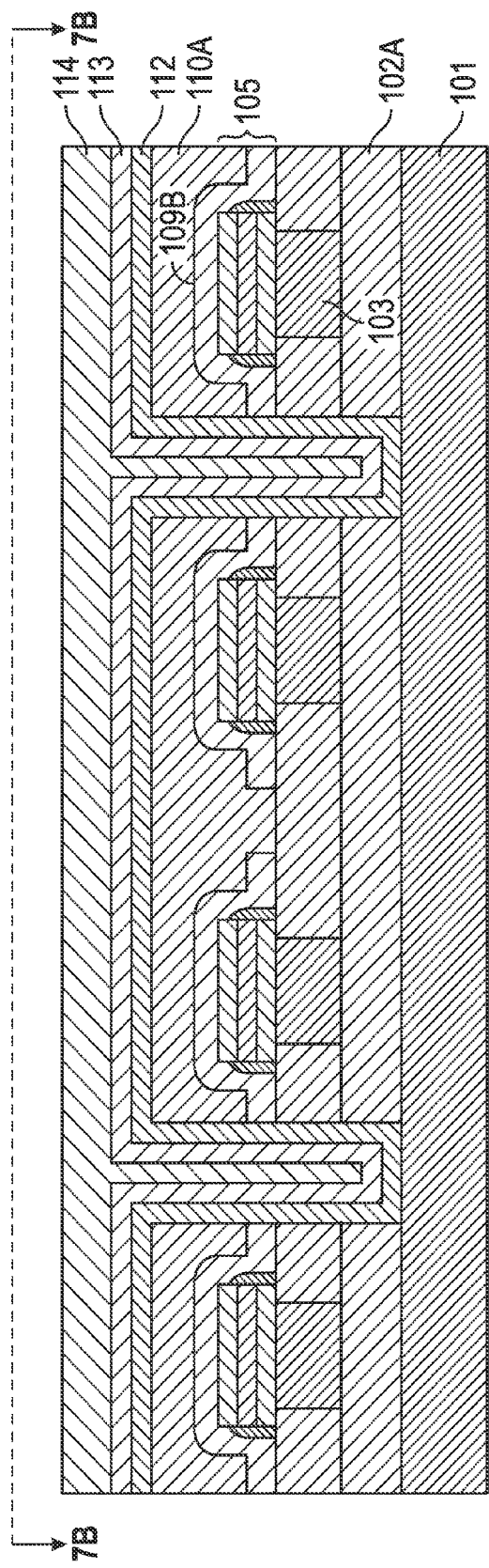
Figure 7B:
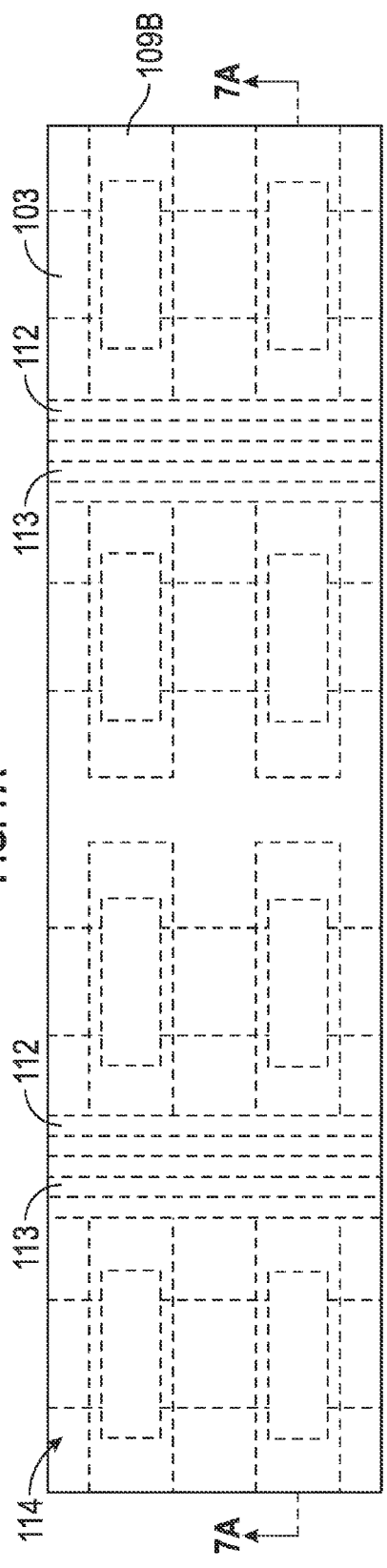

Turning now to FIG. 7, three additional layers 112, 113, and 114 are deposited over the ILD layer segments 110A and within the trenches 111 in a conformal manner. The layer 112 is a further doped silicon layer that is doped using conductivity determining ions of the opposite type as layer 109. For example, in the exemplary embodiment wherein layer 109 was formed using n-type doping ions, layer 112 is formed using p-type doping ions. The layer 112, as with layer 109, may be formed of a doped amorphous silicon or polycrystalline silicon material, and may be formed conformally over the ILD segments 110A and within the trenches 111. As shown, the layer 112 comes in direct contact with the exposed portions of the word line metal layer 101 at the bottom of trenches 111, as wells as an end of doped silicon segments 109B that are exposed at the sidewalls of the trenches 111. The layer 113 is yet a further doped silicon layer that is doped using conductivity determining ions of the opposite type as layer 112 (i.e., the same type as layer 109). For example, in the exemplary embodiment wherein layer 109 was formed using n-type doping ions, layer 113 is also formed using n-type doping ions. The layer 113, as with layer 109, may be formed of a doped amorphous silicon or polycrystalline silicon material, and may be formed conformally over the ILD segments 110A and within the trenches 111. Layer 114 is a metal layer that may act as a source line for the STT-MRAM structures to be formed in the integrated circuit. Blanket deposition techniques may be used to deposit layer 114, which accordingly fills any remaining open portions of the trenches 111 not filled by layers 112 and 113, as well as being deposited to a thickness over the ILD segments 110A. Layer 114 may be formed of a suitable conductive material, such as copper or other materials as are known in the art.

FIG. 7 thus illustrates an embodiment of a STT-MRAM structure in accordance with the present disclosure exhibiting a reduced space requirement or reduced "footprint" as compared to structures previously known in the art. Beneficially, the disclosed structure protects against the above-described source degeneration effect with the bit line metal layer 103 being provided in series with the fixed layer of the MTJ stack 107, and the source line metal layer 114 being in series with the free layer of the MTJ stack 107 (with the word line metal layer 101 functioning as a gate of a transistor between the source line 114 and the free layer of the MTJ stack 107). The p-n junction diode formed between layers 112, 113, and 114 regulates the direction of flow of current upon application of current to the source line 114.

Figure 8:
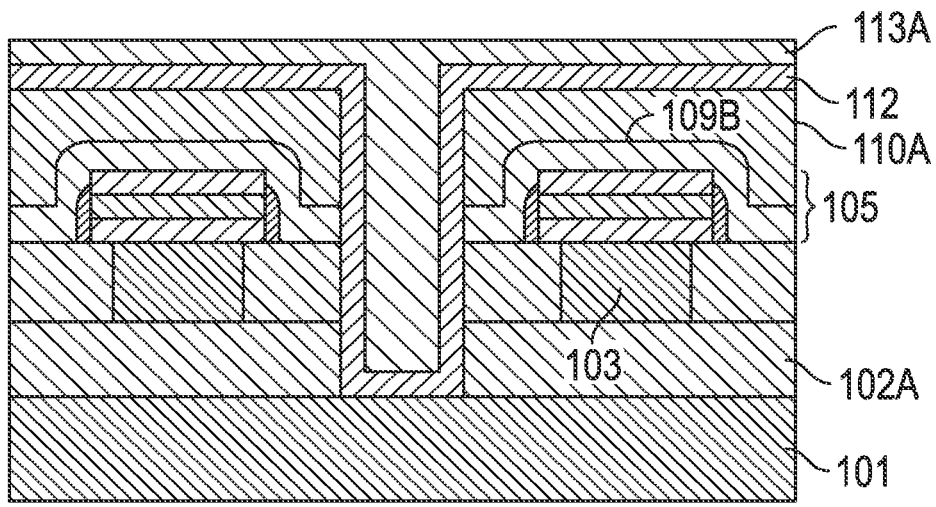

In another embodiment in accordance with the present disclosure as shown in FIG. 8, the function of the source line metal layer 114 may be integrated with the doped silicon layer 113. That is, instead of conformal deposition of the layer 113 as shown in FIG. 7, a layer 113A may be formed using blanket deposition techniques to fill any remaining portions of the trenches 111 not filled by layer 112. The doping and composition of layer 113A are the same in all other aspects as described above with regard to the formation of layer 113.

Figure 9:
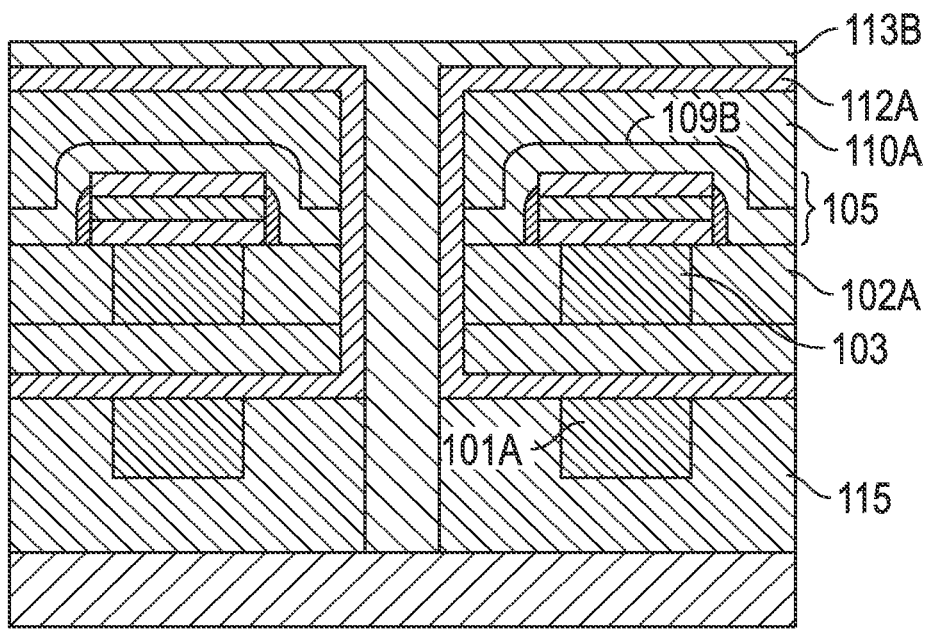

In yet another embodiment in accordance with the present disclosure as shown in FIG. 9, the word line may be formed extending parallel (as opposed to perpendicularly) to the bit line. In order to ensure contact between the p-n diode and the word line, a layer 112A is formed in place of layer 112, wherein layer 112A extends underneath ILD segments 102A to for direct physical contact with the word line 101A. A further ILD layer 115 is provided to insulate the word line 101A. The trench 111 may be extended to the ILD layer 115, and may contact with a repositioned source line 114A positioned below the ILD layer 115.

The process to form the structure of FIG. 9 is as follows. Source line or substrate 114A is formed extending in one direction, as shown. Then ILD 115 is formed over source line 114A. Word line 101A is formed perpendicularly to the source line 114A. P-type silicon 112A is formed extending over the word line 101A and the ILD 115. Then, further ILD followed by bit line, which is parallel to the word line, MRAM stack, spacers, first silicon layer, and still further ILD is formed. Trench 111 is then etched to define cells, the etch extending into the p-type silicon layer 112A. Further conformal p-type silicon material is deposited over the top ILD layer and along the sidewalls of the trench 111 to form a continuous p-type silicon layer. This is followed by further etching the trench into ILD 115 to contact with the source line 114A, and deposition of n-type silicon to fill the trench and contact with the p-type silicon and the source line 114A, resulting in a structure as shown in FIG. 9.

Figure 10:
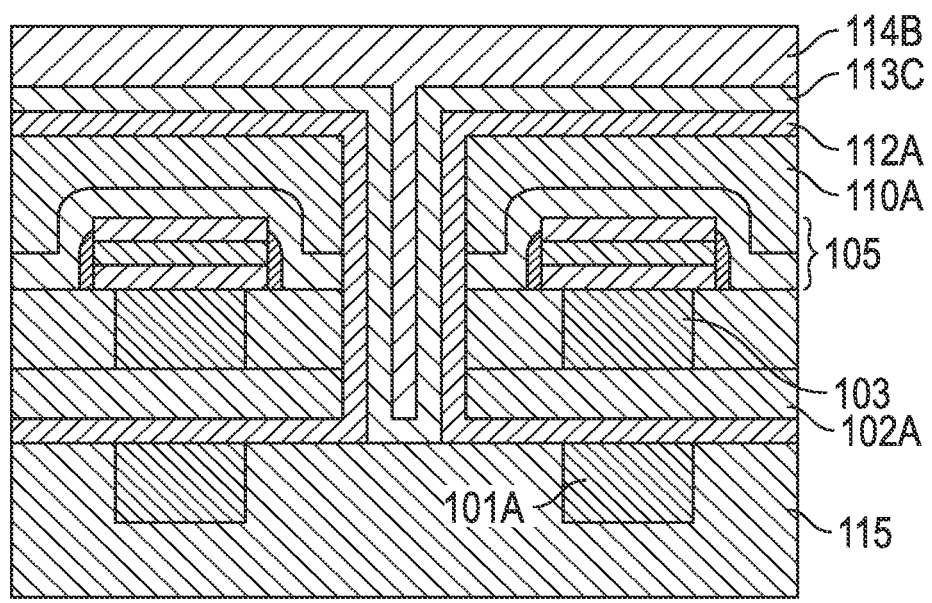

In still a further embodiment in accordance with the present disclosure as shown in FIG. 10, a source line 114B may be positioned above the doped silicon layers as in FIG. 7, while still using the parallel bit/source lines as in FIG. 9. In this embodiment, a layer 113 of doped silicon with the same doping type as the segments 109B extends conformally to the bottom of the trenches 111, with a source line metal layer 114B providing the fill to fill any remaining portions of the trenches 111, as described above with regard to FIG. 7.

Figure 11A:
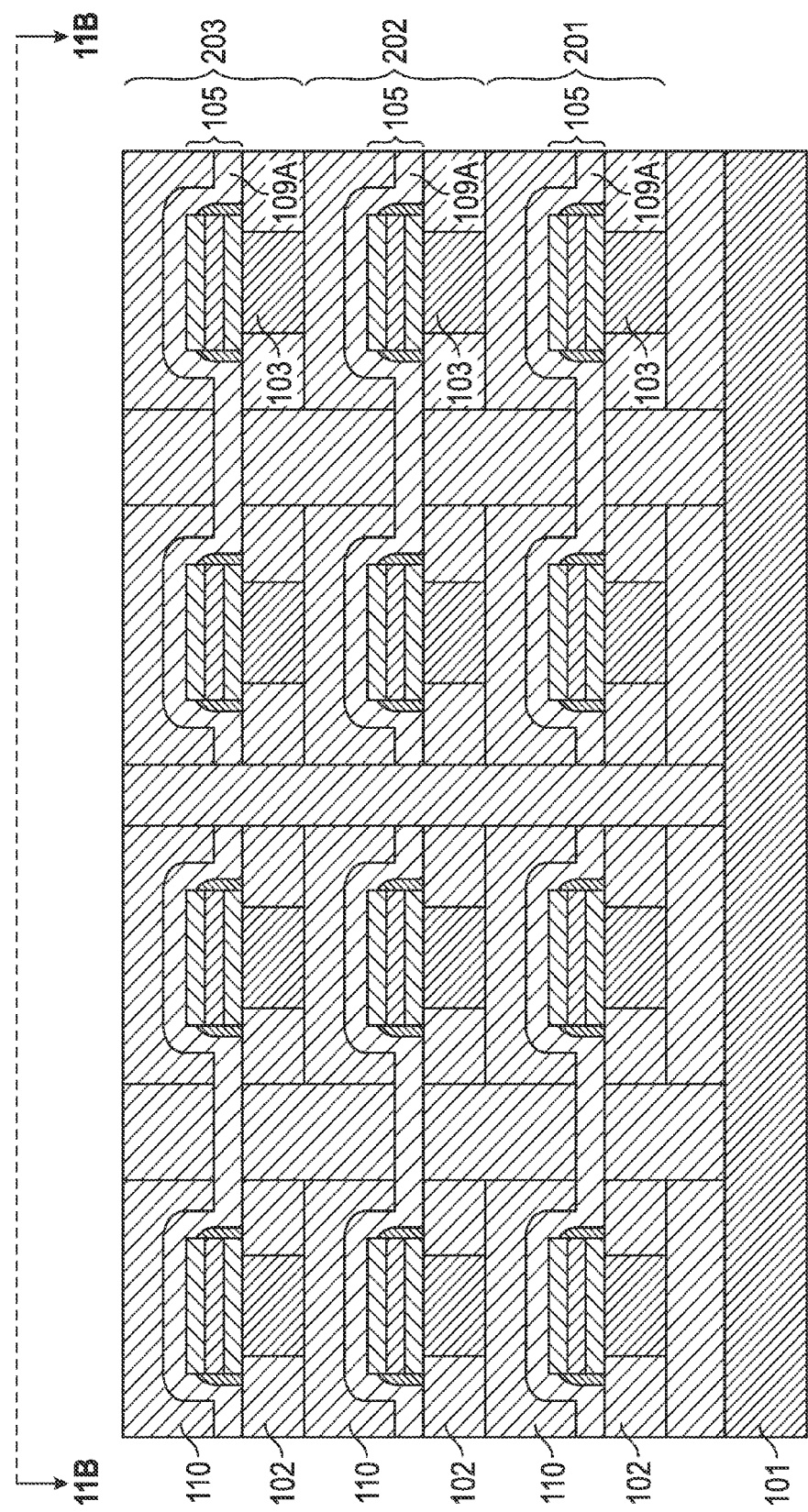
Figure 12A:
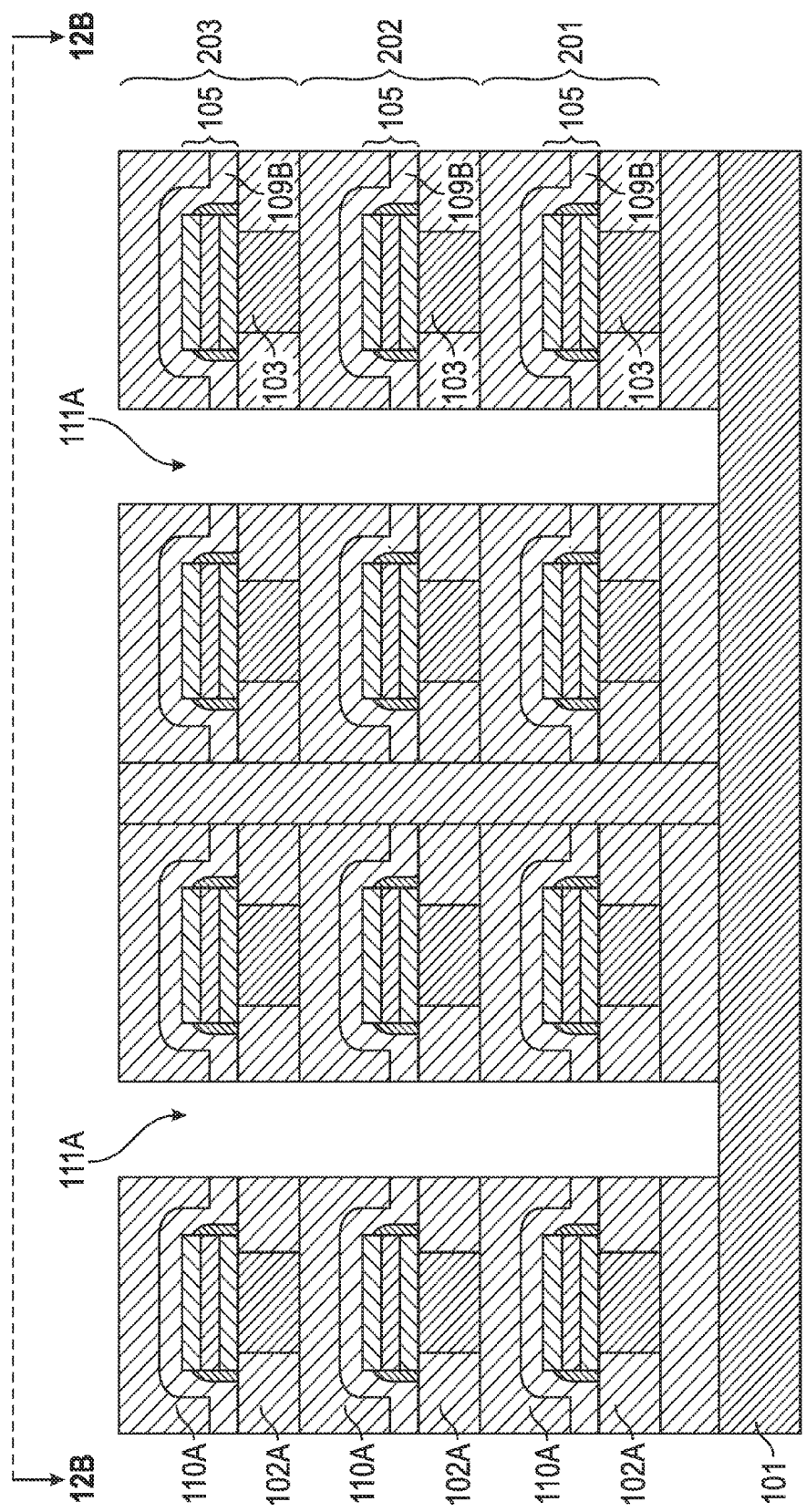
Figure 13A:
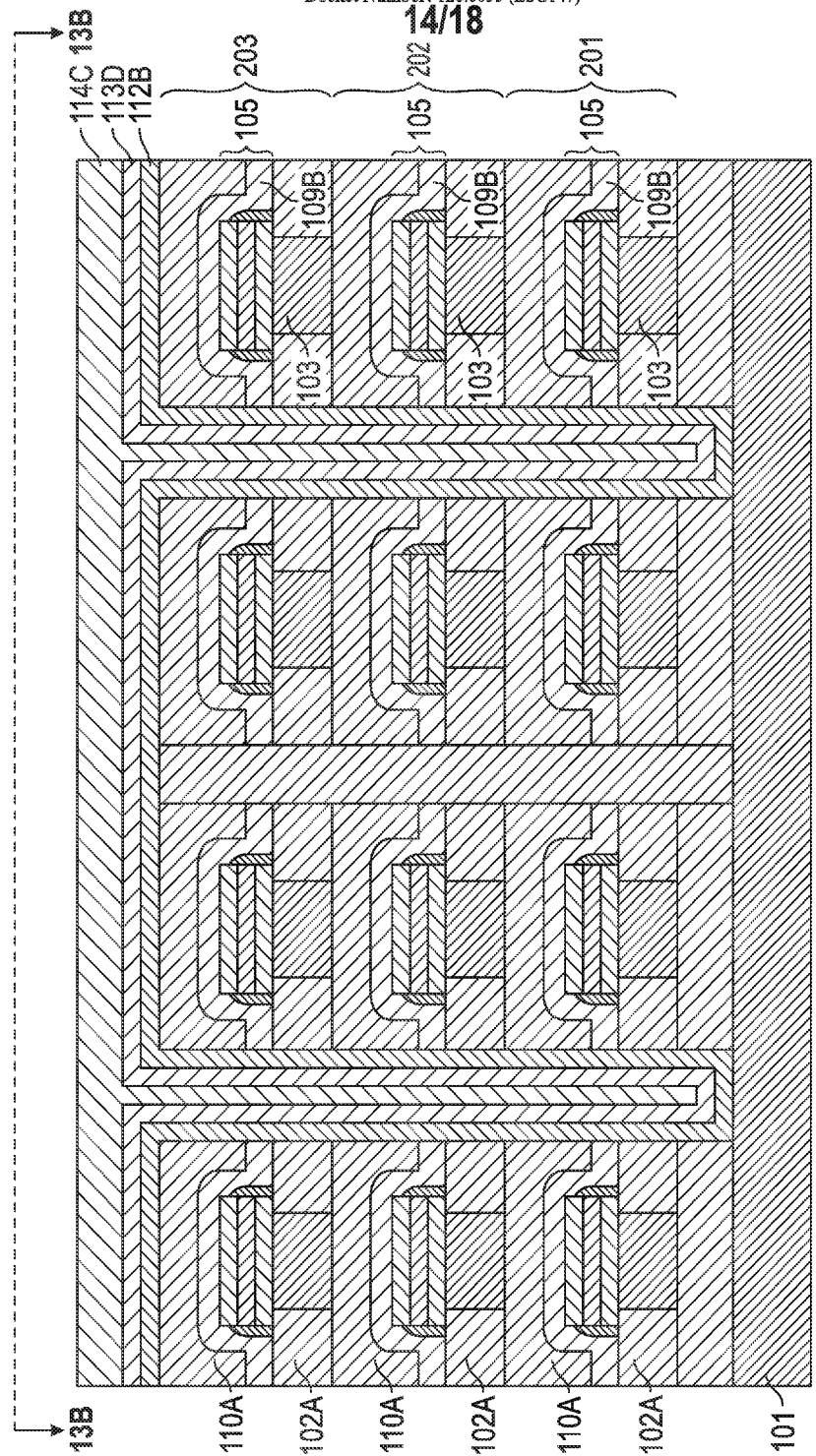
Figure 13B:
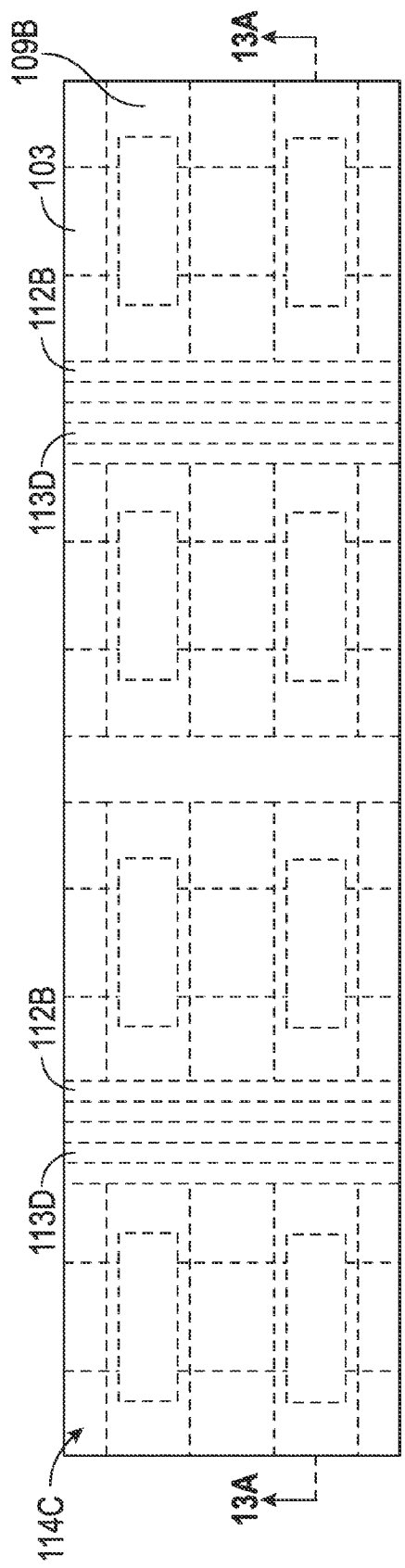

Various embodiments of the present disclosure may also be modified to accommodate multiple layers of MRAM structures, as shown in connection with FIGS. 11 through 16. The process steps shown in FIG. 11 are performed after those described above in connection with FIGS. 1A through 5B, which are not repeated herein for brevity. In FIG. 11, the process disclosed above with regard to FIGS. 1A through 5B is repeated one or more times to form a plurality of MRAM layers, three of which, 201, 202, and 203 are shown in FIG. 11. As shown in FIG. 12, the elongated trenches 111A are formed all the way through each of the layers 201, 202, and 203 to expose portions of the word line metal layer 101, analogously to the process shown in FIG. 6, with the difference being that the etch to form the trenches extends deeper so as to pass through each of layers 201, 202, and 203. Further, as shown in FIG. 13, layers 112B, 113D, and 114C are formed analogously to layers 112, 113, and 114 shown in FIG. 7, with the difference being that each layer extends vertically a greater distance to extending downward through the elongated trenches 111A for physical and electrical contact with each of the segments 109B of each respective layer 201, 202, and 203, as well as for physical and electrical contact with the source line 101.

Figure 14:
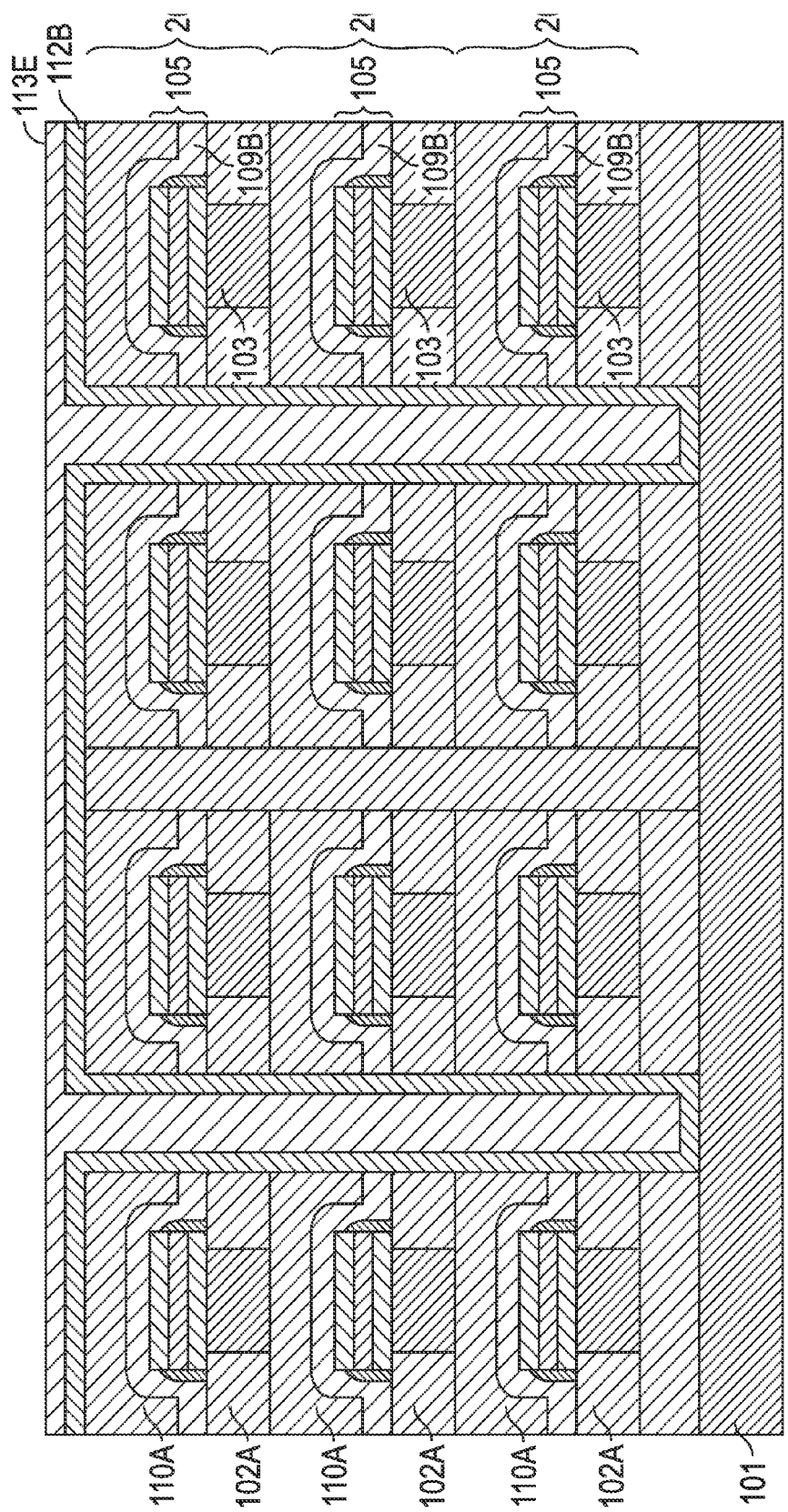
Figure 15:
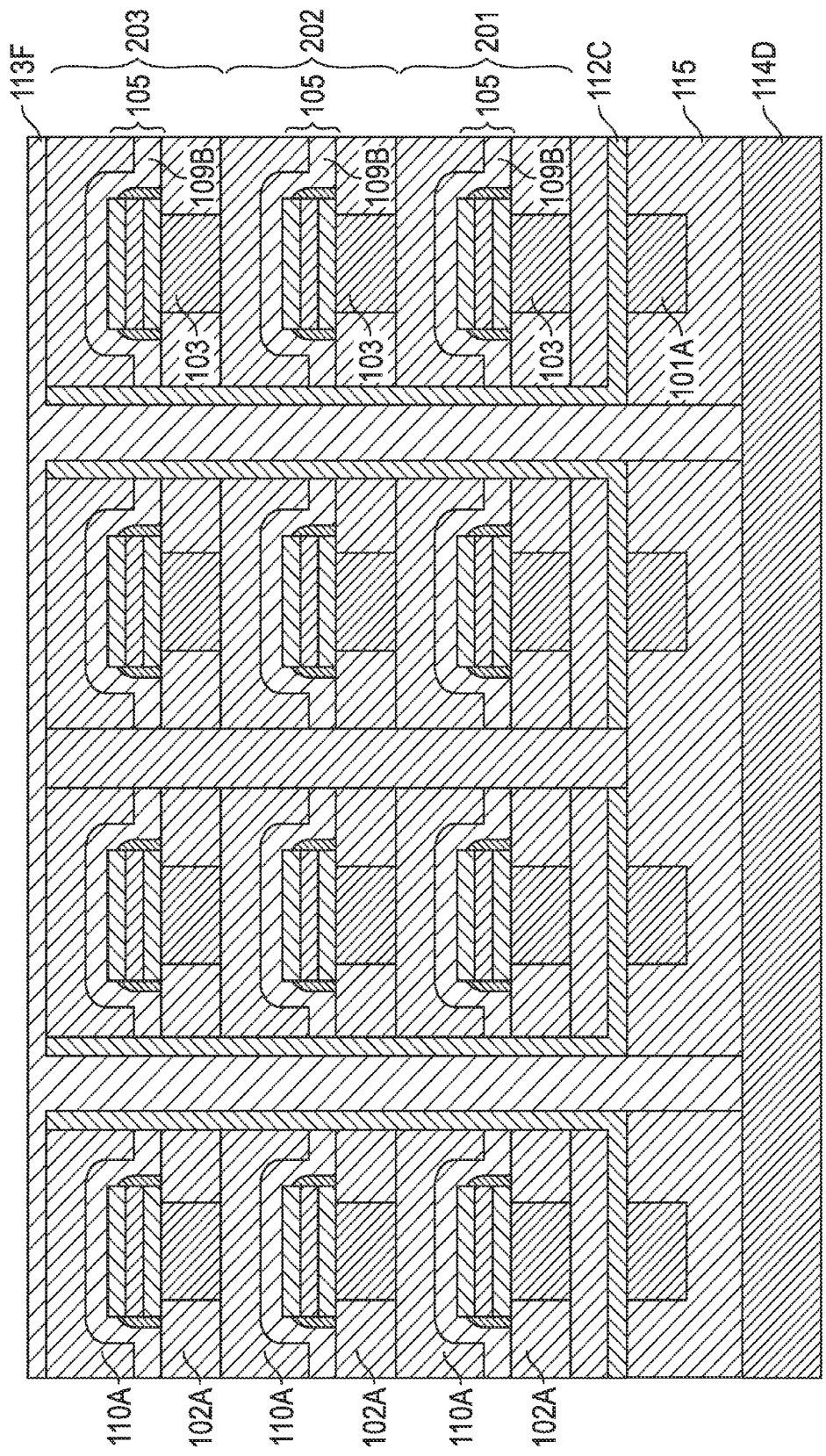
Figure 16:
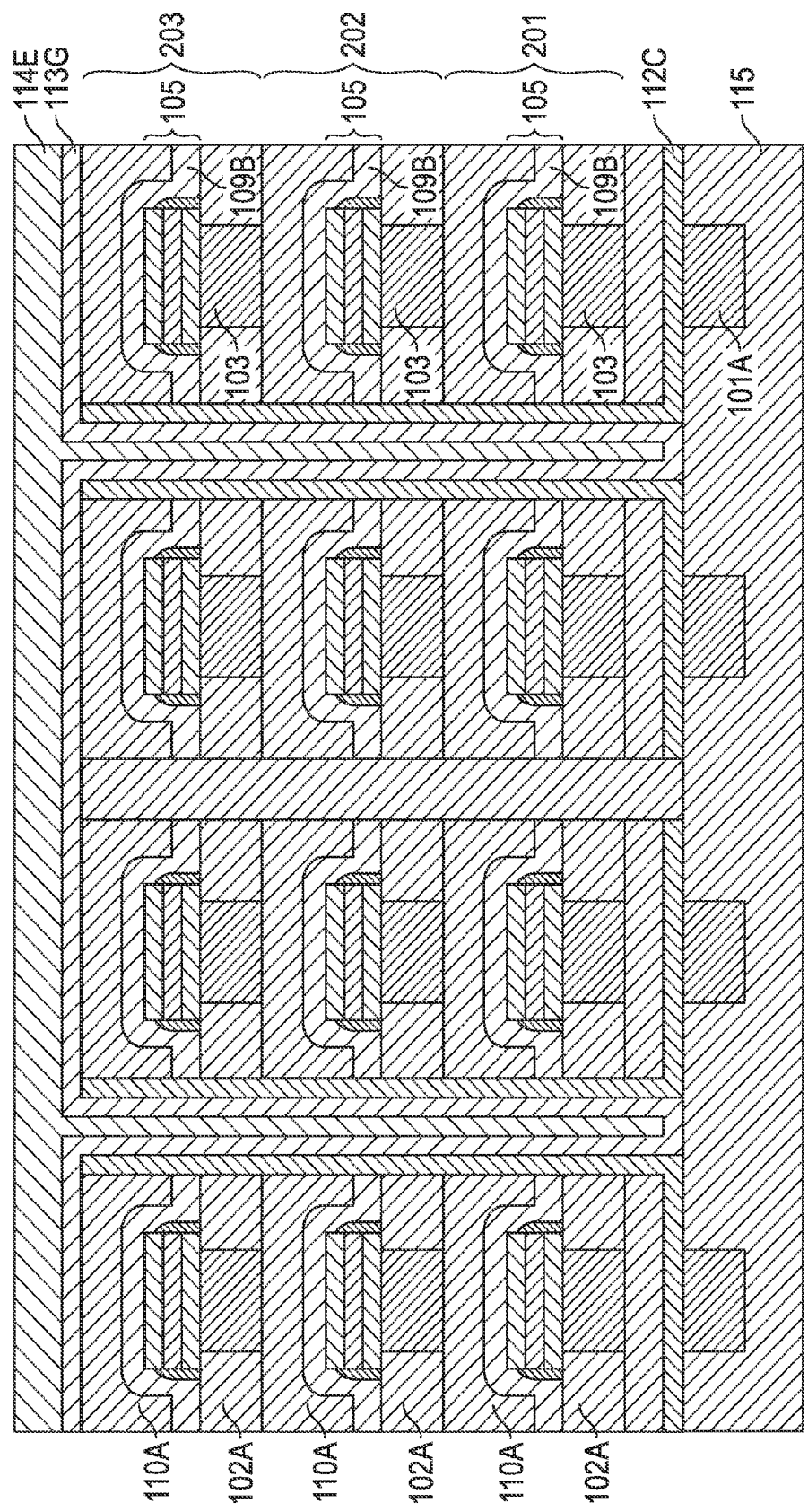

Furthermore, FIGS. 14, 15, and 16 provide analogous embodiments to those shown in FIGS. 8, 9, and 10, respectively, with application to multiple layers 201, 202, and 203. As the same numbering convention is used with each such embodiment, further description thereof need not be provided herein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. An integrated circuit comprising:
   a word line layer;
   a bit line layer;
   a magnetic random access memory (MRAM) stack in contact with the bit line layer;
   a first doped silicon layer in contact with the MRAM stack, the first doped silicon layer comprising conductivity-determining ions of a first type;
   a second doped silicon layer in contact with the first doped silicon layer and further in contact with the word line layer, the second doped silicon layer comprising conductivity-determining ions of a second type that is opposite the first type;
   a third doped silicon layer in contact with the second doped silicon layer; and
   a source line layer in electrical contact with the third doped silicon layer,
   wherein the word line layer extends substantially perpendicularly with respect to the bit line layer, the integrated circuit further comprising a first interlayer dielectric (ILD) layer below the first doped silicon layer and a second ILD layer above the first doped silicon layer, wherein the first doped silicon layer and the first and second ILD layer form a common sidewall that extends vertically above the word line layer, and wherein the second doped silicon layer is formed along the common sidewall along the first doped silicon layer and the first and second ILD layers.

2. The integrated circuit of claim 1, wherein the third doped silicon layer comprises conductivity ions of the first type.

3. The integrated circuit of claim 2, wherein each of the word line layer, bit line layer, and source line layers comprise a metal material.

4. The integrated circuit of claim 1, wherein the source line layer is in electrical contact with the third doped silicon layer which in turn is in contact with the second doped silicon layer, the third doped silicon layer comprising conductivity ions of the first type.

5. The integrated circuit of claim 4, wherein the word line layer and the bit line layers comprise a metal material.

6. The integrated circuit of claim 1, wherein the MRAM stack comprises a top electrode, a magnetic tunnel junction (MTJ) stack, and a bottom electrode, or, alternatively, wherein the MRAM stack is replaced with an RRAM, PCRAM, or any other memory element.

7. The integrated circuit of claim 6, wherein the MTJ stack comprises a fixed layer, a free layer, and a barrier layer between the fixed layer and the free layer.

8. The integrated circuit of claim 1, wherein the first doped silicon layer comprises a plurality of discontinuous segments, each such segment being in contact with one MRAM stack.

9. The integrated circuit of claim 1, wherein the source line layer extends parallel to the common sidewall and is separated from the common sidewall by the third doped silicon layer.

10. The integrated circuit of claim 1, wherein the first conductivity-determining ion type is n-type and the second conductivity-determining ion type is p-type.

11. A method for fabricating an integrated circuit comprising:
    forming a word line layer;
    forming a bit line layer, wherein the word line layer is formed so as to extend substantially perpendicularly with respect to the bit line layer;
    forming a magnetic random access memory (MRAM) stack in contact with the bit line layer;
    forming a spacer structure surrounding the MRAM stack;
    forming a first doped silicon layer in contact with the MRAM stack, the first doped silicon layer comprising conductivity-determining ions of a first type;
    forming a trench through the first doped silicon layer to expose an end portion of the first doped silicon layer;

forming a second doped silicon layer in contact with the end portion of the first doped silicon layer and further in contact with the word line layer, the second doped silicon layer comprising conductivity-determining ions of a second type that is opposite the first type;

forming a third doped silicon layer in contact with the second doped silicon layer;

forming a source line layer in electrical contact with the third doped silicon layer; and forming a first interlayer dielectric (ILD) layer below the first doped silicon layer and a second ILD layer above the first doped silicon layer, wherein forming the trench comprises forming a trench through the first and second ILD layers in addition to through the first doped silicon layer, wherein forming the second doped silicon layer comprises forming a second doped silicon layer along the first and second ILD layers within the trench, and wherein the first doped silicon layer and the first and second ILD layer are formed so as to form a common sidewall that extends vertically above the word line layer, and wherein the second doped silicon layer is formed along the common sidewall along the first doped silicon layer and the first and second ILD layers.

12. The method of claim 11, wherein forming the first doped silicon layer comprises forming an n-type doped silicon layer, and wherein forming the second doped silicon layer comprises forming a p-type doped silicon layer.

* * * * *